United States Patent [19]
Tamba et al.

[11] Patent Number: 5,828,100
[45] Date of Patent: Oct. 27, 1998

[54] INSULATED GATE SEMICONDUCTOR DEVICE HAVING TRENCH GATE AND INVERTER PROVIDED WITH THE SAME

[75] Inventors: Akihiko Tamba, Mito; Yutaka Kobayashi, Hitachinaka, both of Japan

[73] Assignee: Hitachi, Ltd., Tokyo, Japan

[21] Appl. No.: 714,603

[22] Filed: Sep. 16, 1996

[30] Foreign Application Priority Data

Sep. 14, 1995 [JP] Japan .................................. 7-236532

[51] Int. Cl.⁶ ............................. H01L 27/02; H01L 29/74
[52] U.S. Cl. ........................... 257/328; 257/331; 257/334
[58] Field of Search .................................. 257/328, 329, 257/330, 331, 332, 334

[56] References Cited

U.S. PATENT DOCUMENTS

| | | | |
|---|---|---|---|
| 4,672,525 | 6/1987 | Horie et al. .............................. | 363/58 |
| 4,942,445 | 7/1990 | Baliga et al. ............................ | 257/330 |
| 4,961,100 | 10/1990 | Baliga et al. ............................ | 257/330 |
| 5,233,215 | 8/1993 | Baliga . | |
| 5,574,302 | 11/1996 | Wen et al. .............................. | 257/330 |

FOREIGN PATENT DOCUMENTS

| | | |
|---|---|---|
| 6-163889 | 6/1994 | Japan . |
| 6-275818 | 9/1994 | Japan . |
| 7-335878 | 12/1995 | Japan . |

*Primary Examiner*—Donald Monin
*Attorney, Agent, or Firm*—Antonelli, Terry, Stout & Kraus, LLP

[57] ABSTRACT

An insulated gate semiconductor device has a semiconductor substrate having an irregular surface of raised portions and depressed portions, and a main device region and a protective circuit region. The protective circuit region is formed in a raised portion of the semiconductor substrate and includes a semiconductor device which is driven by an insulated gate electrode formed in a depressed portion of the semiconductor substrate. The raised portions and the depressed portions of the semiconductor substrate are formed by a trench etching method.

37 Claims, 16 Drawing Sheets

5,828,100

INSULATED GATE SEMICONDUCTOR DEVICE HAVING TRENCH GATE AND INVERTER PROVIDED WITH THE SAME

BACKGROUND OF THE INVENTION

The present invention relates to an insulated gate semiconductor device having a trench gate.

The field of practical application of insulated gate controlled bipolar transistors (IGBTs) has steadily expanded owing to their advantages of simplifying a gate drive circuit and wide safe operation area (SOA). The IGBT suffers from a large power loss because the IGBT is a nonlatch-up device. Efforts have been made to lower the collector saturation voltage to reduce power loss.

One of previously proposed methods of reducing power loss employs a trench gate of a trench structure instead of a planar gate of a planar structure (FIG. 3). The trench gate was published for the first time in 1986 in D. Ueda, K. Kitamura, H. Takagi, G. Kano, "A New Injection Suppression Structure for Conductivity Modulated Power MOSFETs", SSDM Tech. Dig., p. 97, 1986.

The trench gate enables the elimination of a parasitic JFET (junction gate field effect transistor), which is a problem in the planar gate, so that voltage drop attributable to the parasitic JFET can be prevented and the width of unit cells can be reduced to increase MOS channel density. Consequently, the collector saturation voltage can greatly be lowered. However, saturation current increases thereby to deteriorate short circuit endurance.

The deterioration of short circuit endurance resulting from an increase in saturation current is an impediment to the enhancement of the performance (reduction of collector saturation voltage) of currently used planar IGBTs. Therefore, trials have been made to enhance short circuit endurance by providing an IGBT with a built-in protective circuit 30 as shown in FIG. 4. The protective circuit comprises a MOSFET (MOS field effect transistor) 31 and a diode 32.

It is expected that the short circuit endurance of a trench IGBT can be enhanced by providing the trench IGBT with a built-in protective circuit.

SUMMARY OF THE INVENTION

Accordingly, it is an object of the present invention to provide a trench gate semiconductor device provided with a built-in protective circuit.

A semiconductor device in accordance with the present invention employs a semiconductor substrate having an irregular surface i.e., raised portions and depressed portions in a surface of the substrate. The semiconductor substrate has a first and a second region. One of the first and the second region is a main device region for a main device, and the other is a protective circuit region for a protective circuit for protecting the main device. A first semiconductor layer of a first conductivity type formed in a raised portion of the semiconductor substrate, a second semiconductor layer of a second conductivity type and a third semiconductor layer are formed in the first region. An insulated gate is formed contiguously with the surface of the first semiconductor layer between the second semiconductor layer and the third semiconductor layer in a depressed portion of the first region. At least a fourth semiconductor layer of the first conductivity type is formed in a raised portion of the semiconductor substrate, a fifth semiconductor layer of the second conductivity type is formed in the fourth semiconductor layer, and a sixth semiconductor layer of the second conductivity type adjacent to the fourth semiconductor layer is formed in the second region. An insulated gate is formed in a depressed portion of the semiconductor substrate adjacent to the surface of the fourth semiconductor layer in the second region.

The raised portions and the depressed portions can be formed in the surface of the semiconductor substrate by a groove forming method that forms trenches of a large aspect ratio.

The first and the second conductivity types are different conductivity types, i.e., a p-type and an n-type. The present invention is applicable to various insulated gate semiconductor devices, such as MOSFETs, IGBTs and MOS thyristors. The IGBT and the MOS thyristor have a seventh semiconductor layer of the first conductivity type.

The above and other objects, features and advantages of the present invention will become more apparent from the following description.

BRIEF DESCRIPION OF THE DRAWINGS

Figure 2:
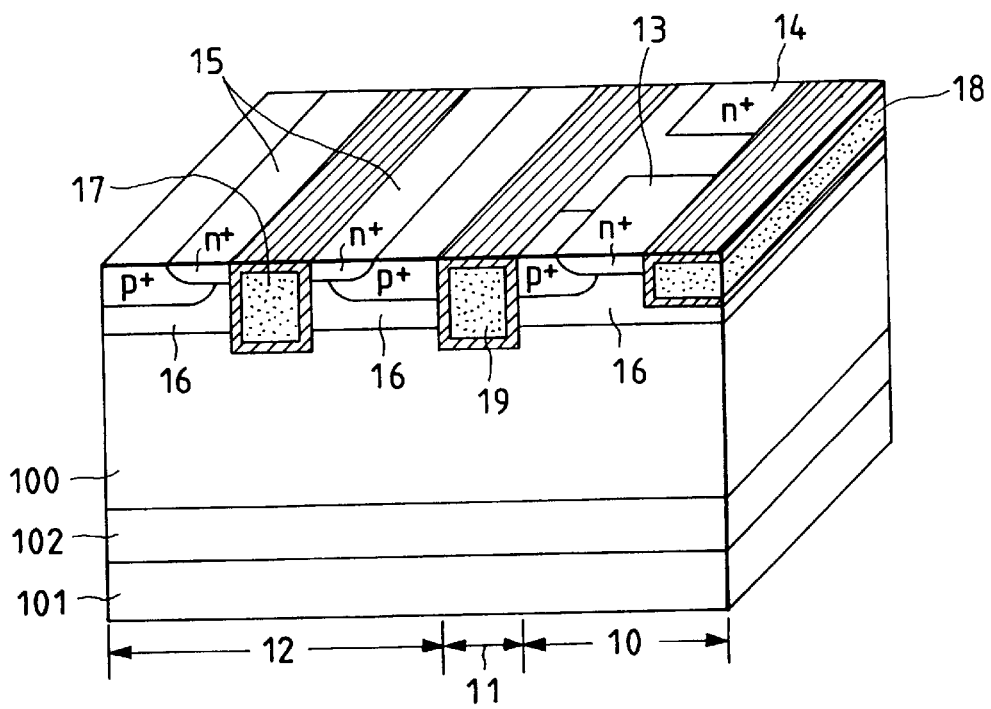
FIG. 2 is a typical perspective view of a semiconductor device in a second embodiment of the present invention.
Figure 3:
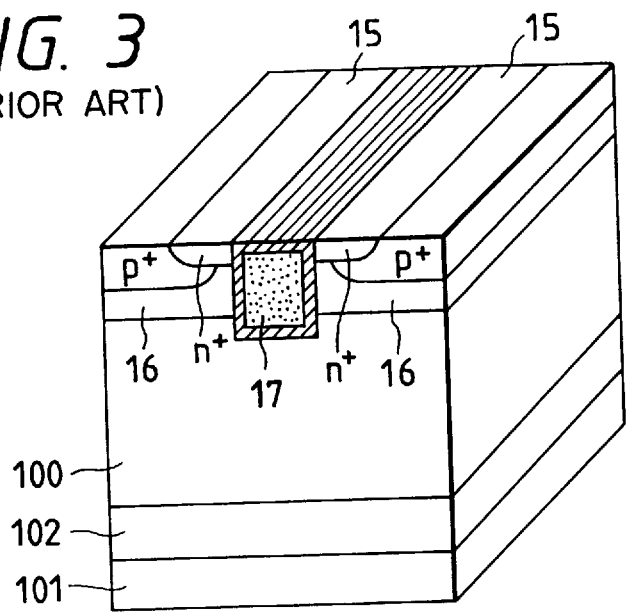
FIG. 3 is a typical perspective view of a conventional trench gate IGBT.
Figure 5:
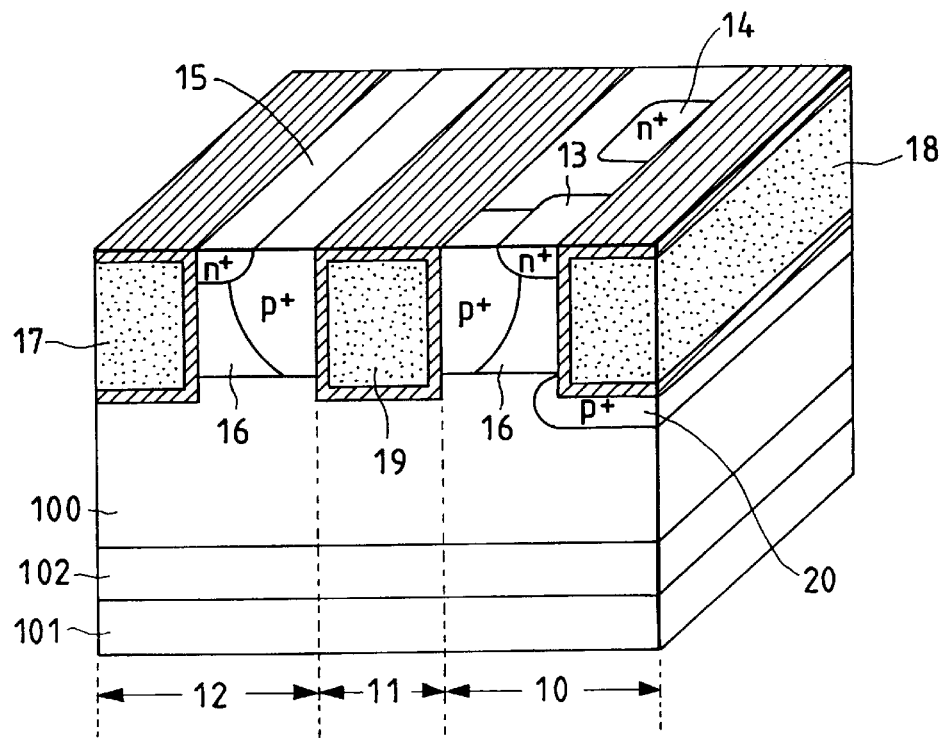
FIG. 5 is a typical perspective view of a semiconductor device in a third embodiment according to the present invention.
Figure 6:
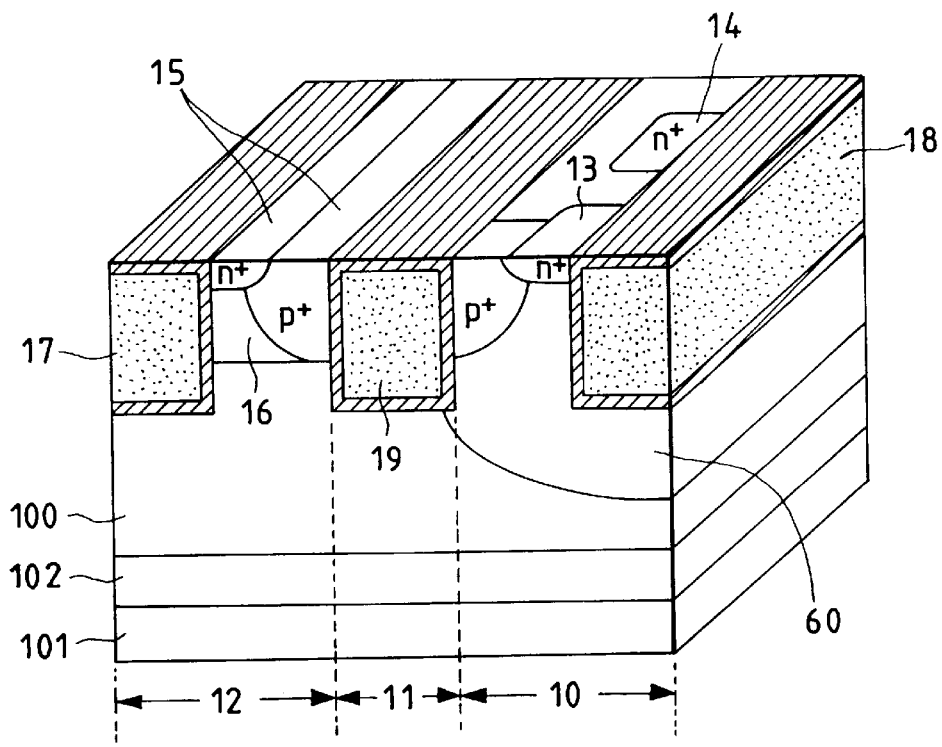
FIG. 6 is a typical perspective view of a semiconductor device in a fourth embodiment according to the present invention.
Figure 7A:
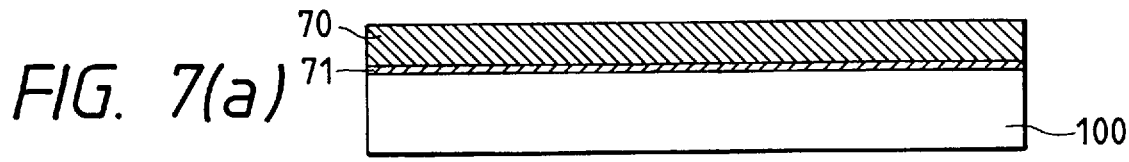
Figure 7B:
Figure 7C:
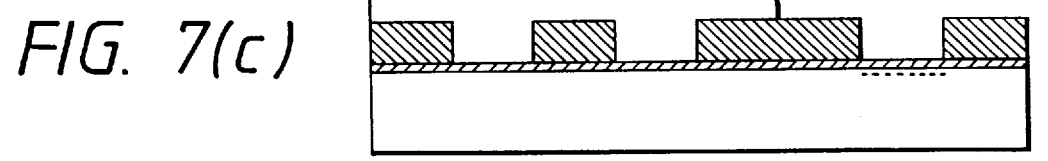
Figure 7D:
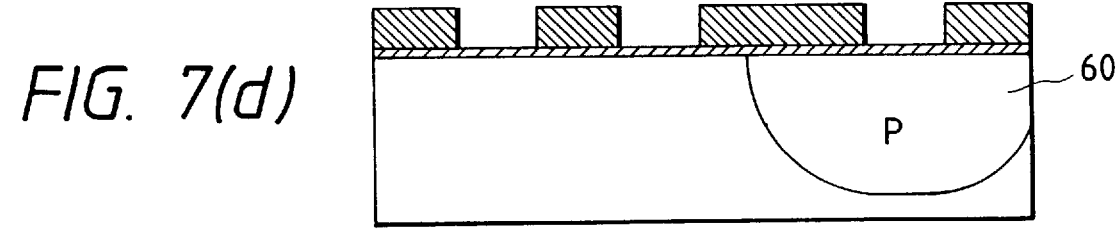
Figure 7E:
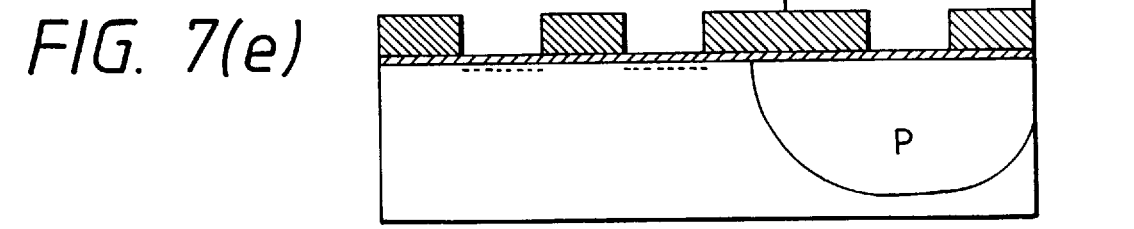
Figure 8F:
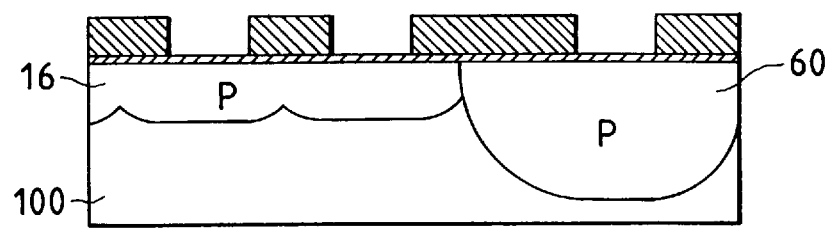
Figure 8G:
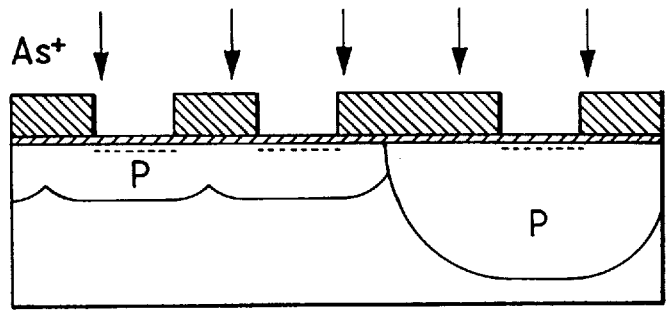
Figure 8H:
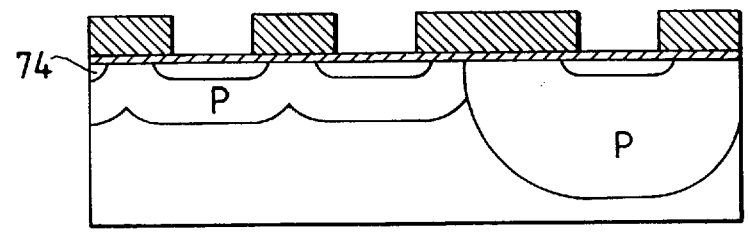
Figure 8I:
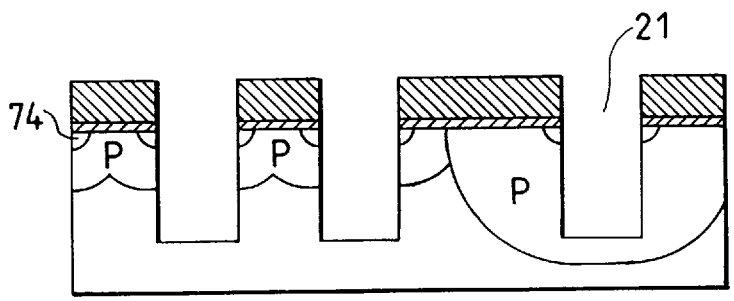
Figure 8J:
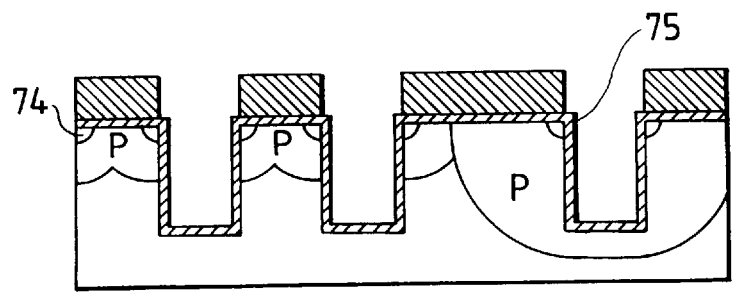
Figure 9K:
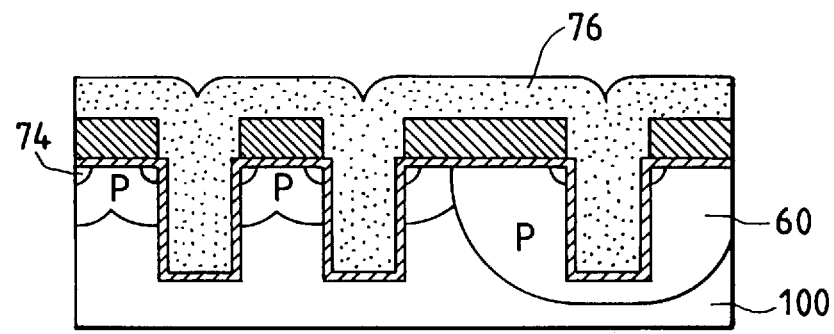
Figure 9L:
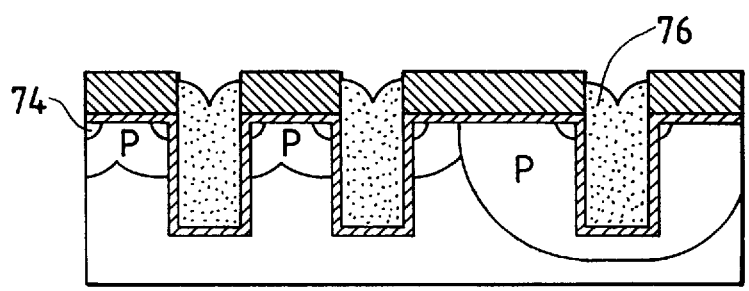
Figure 9M:
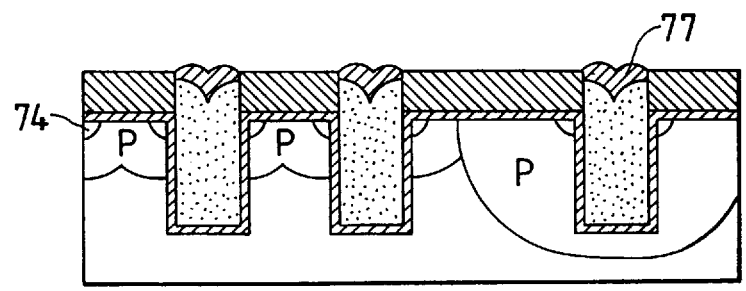
Figure 9N:
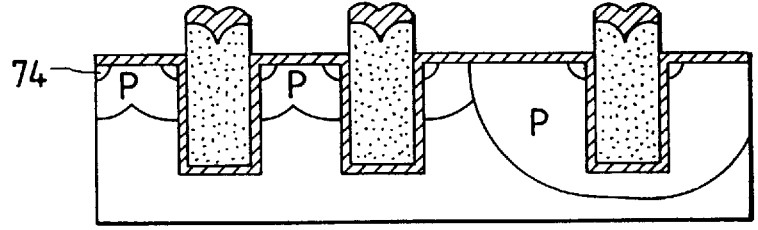
Figure 9O:
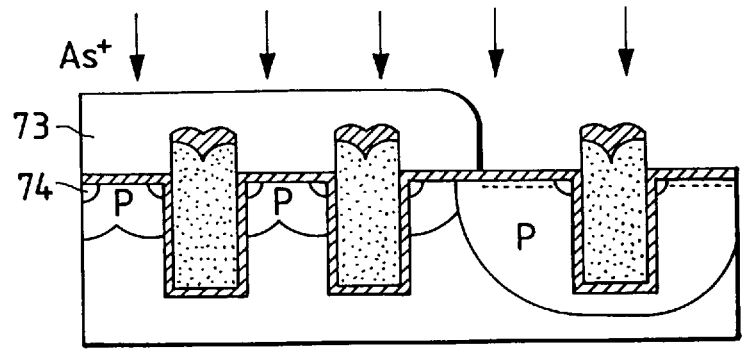
Figure 10P:
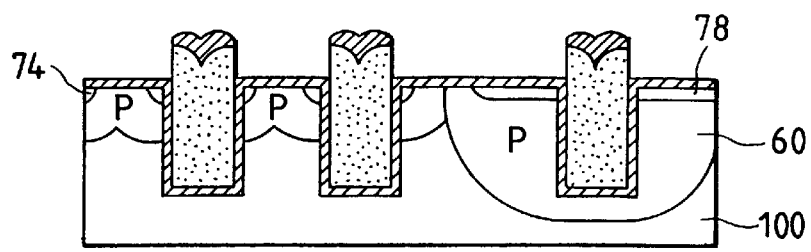
Figure 10Q:
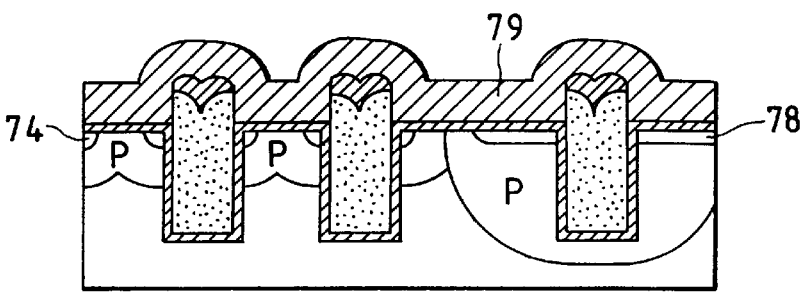
Figure 10R:
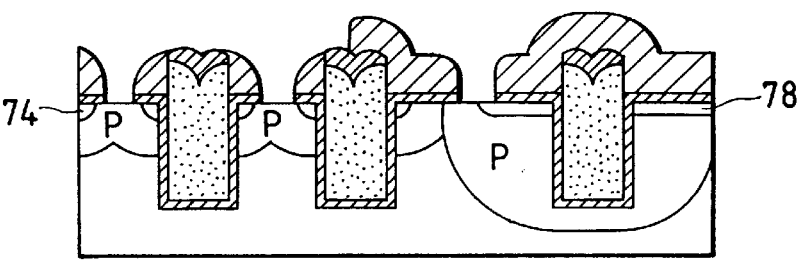
Figure 10S:
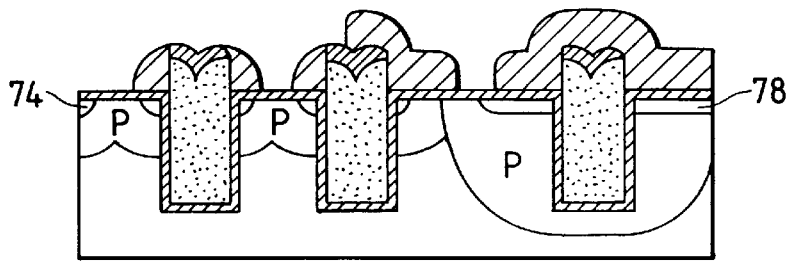
Figure 10T:
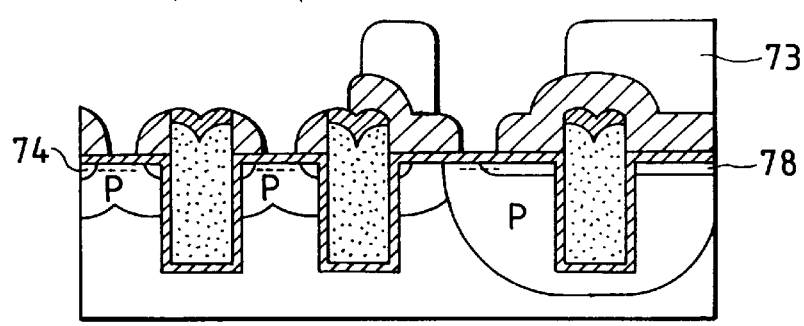
Figure 11U:
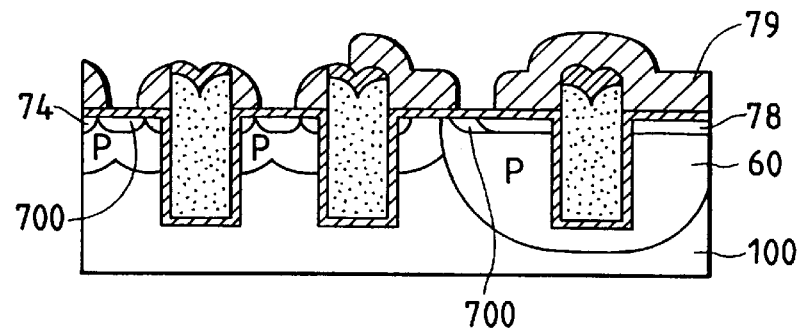
Figure 11V:
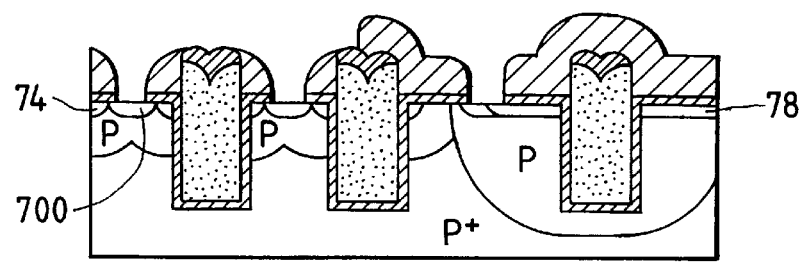
Figure 11W:
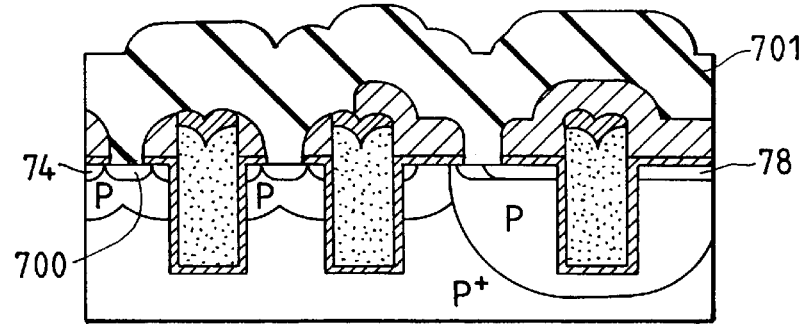
Figure 11X:
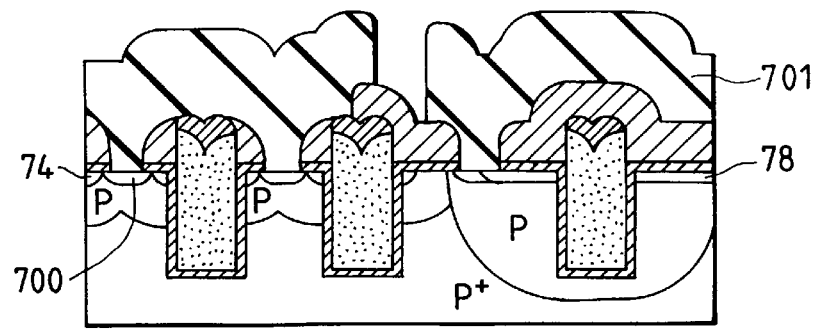
Figure 12A:
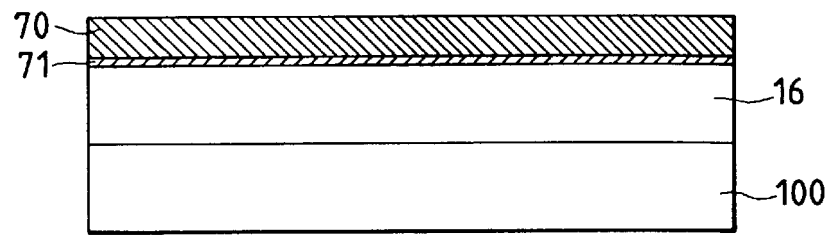
Figure 12B:
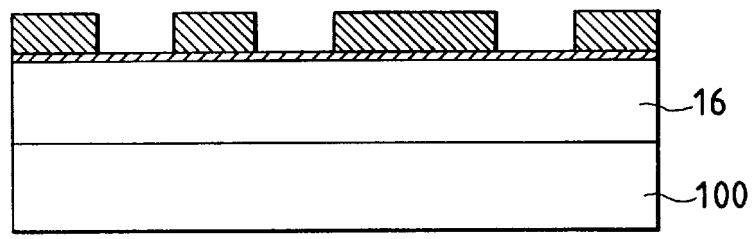
Figure 12C:
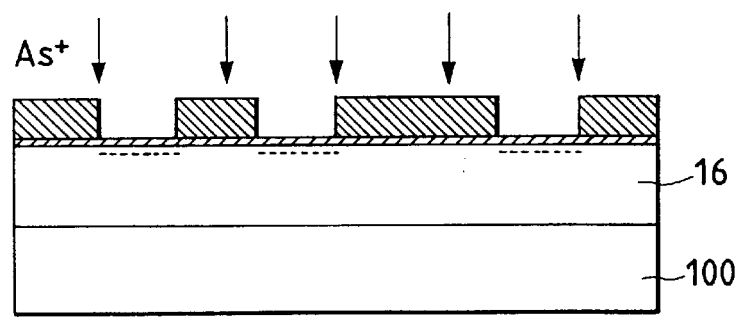
Figure 12D:
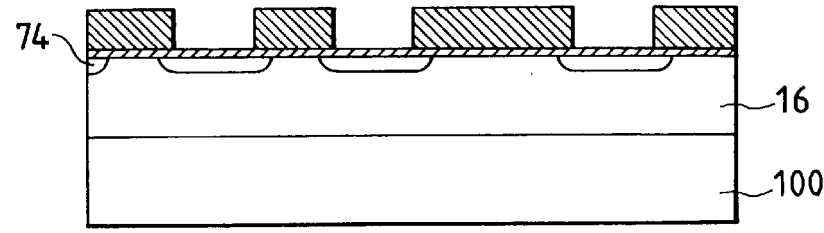
Figure 12E:
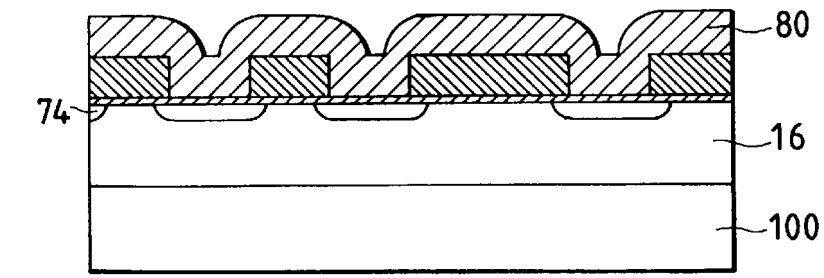
Figure 13F:
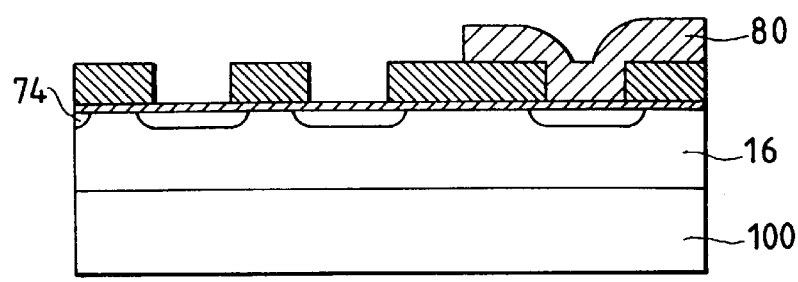
Figure 13G:
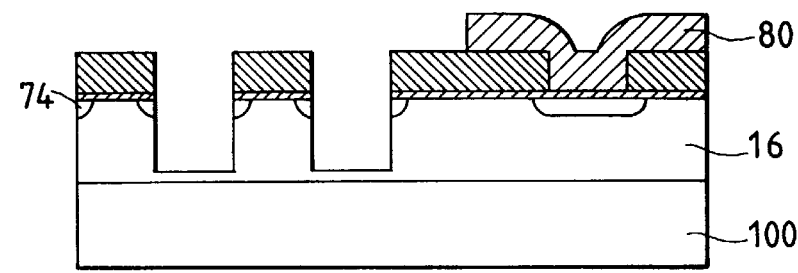
Figure 13H:
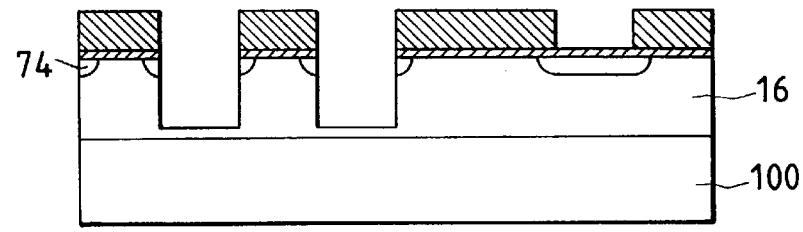
Figure 13I:
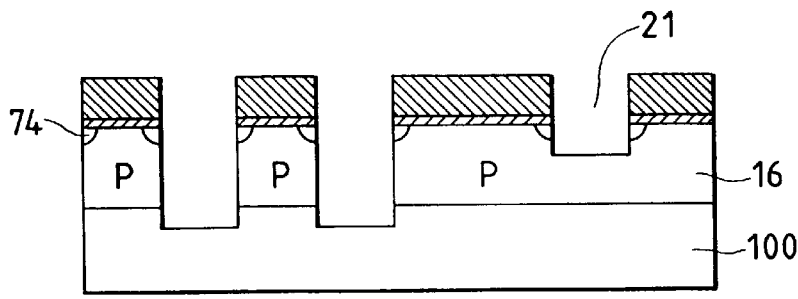
Figure 13J:
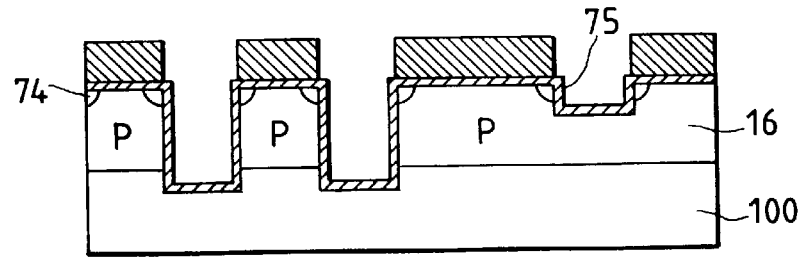
Figure 14K:
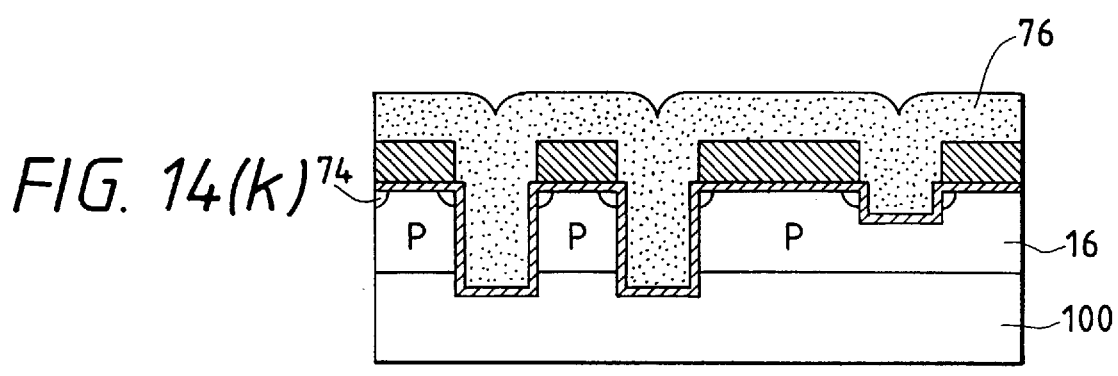
Figure 14L:
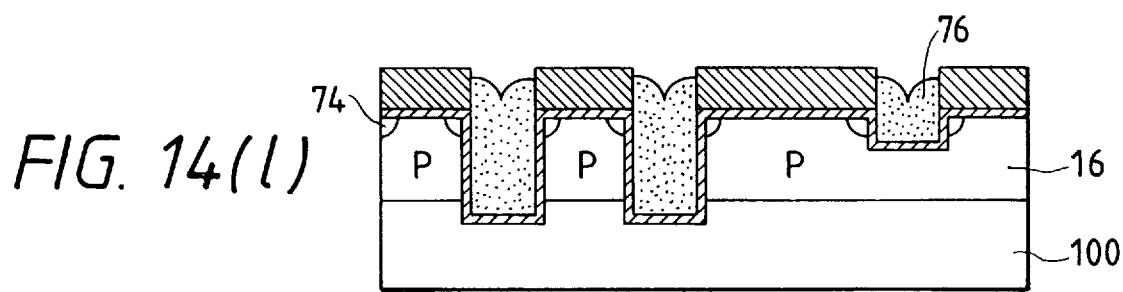
Figure 15A:
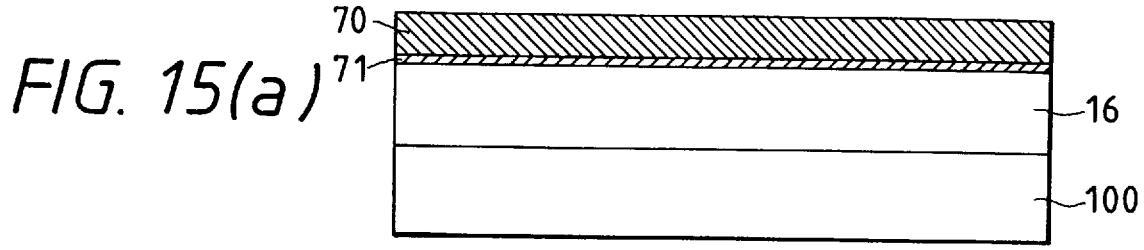
Figure 15B:
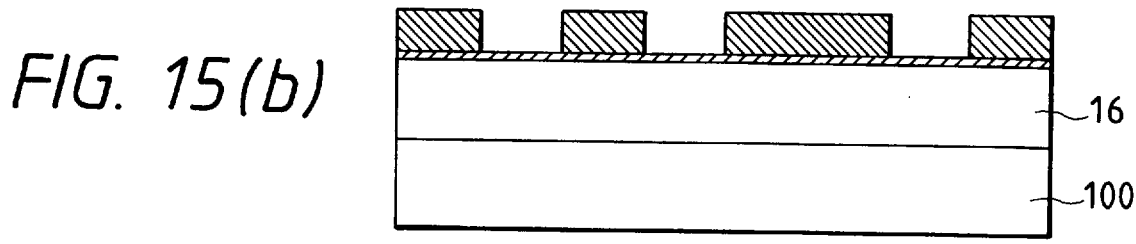
Figure 15C:
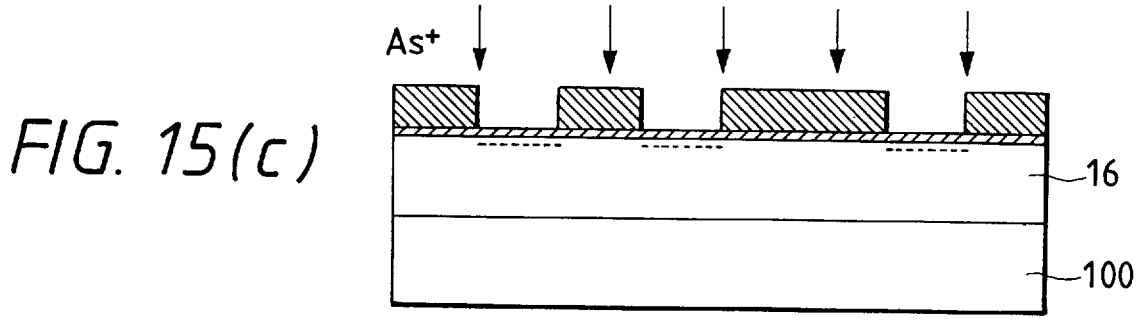
Figure 15D:
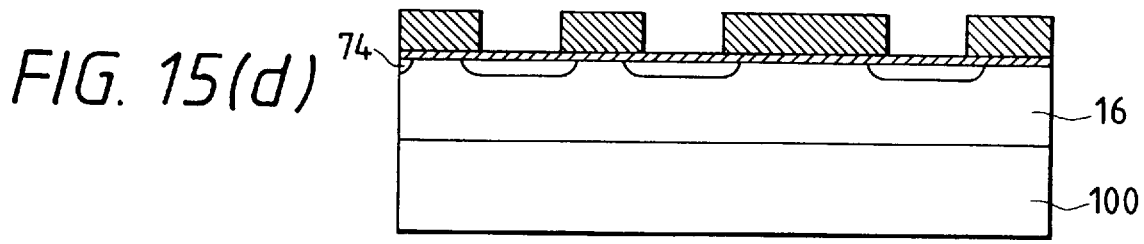
Figure 15E:
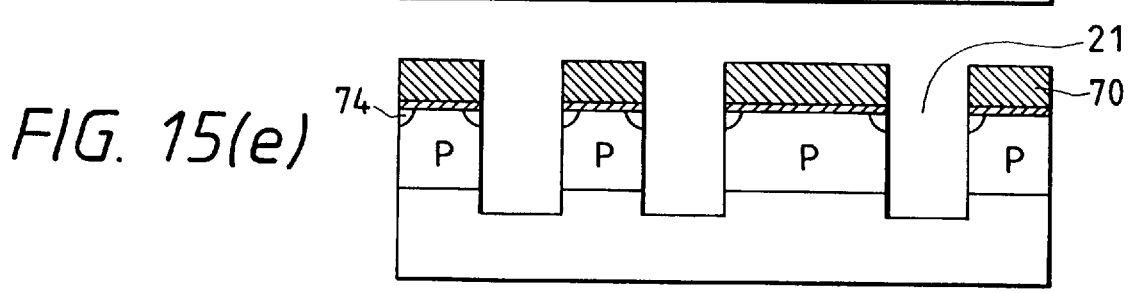
Figure 16F:
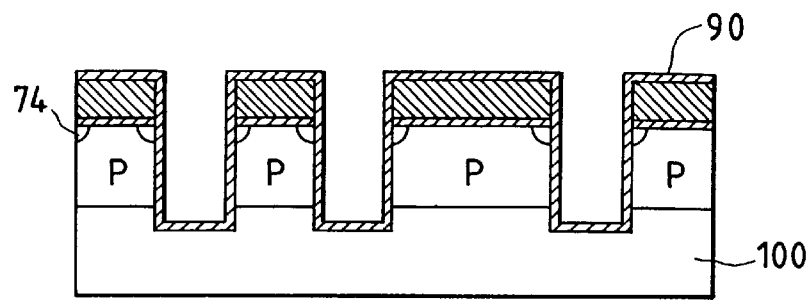
Figure 16G:
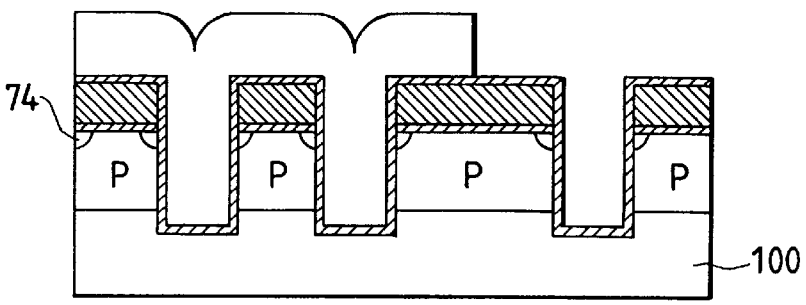
Figure 16H:
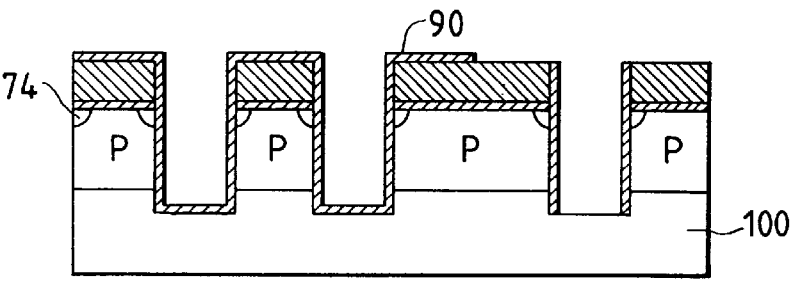
Figure 16I:
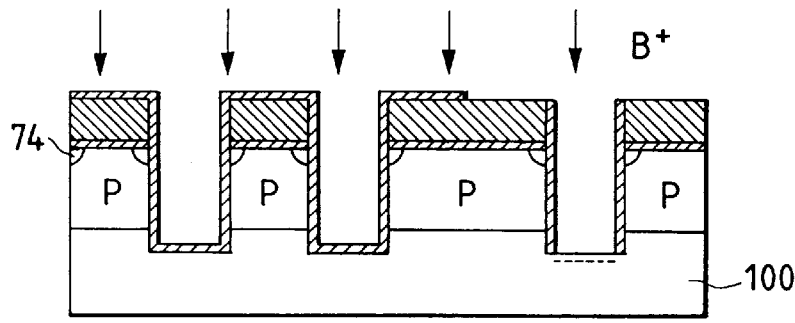
Figure 16J:
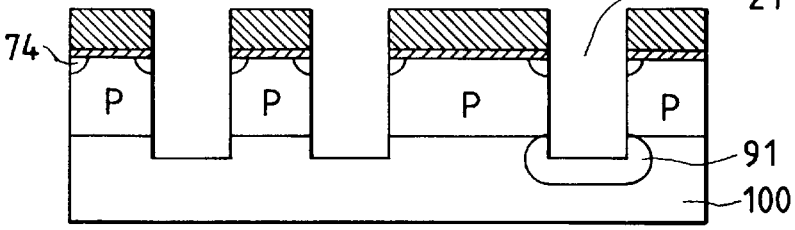
Figure 17K:
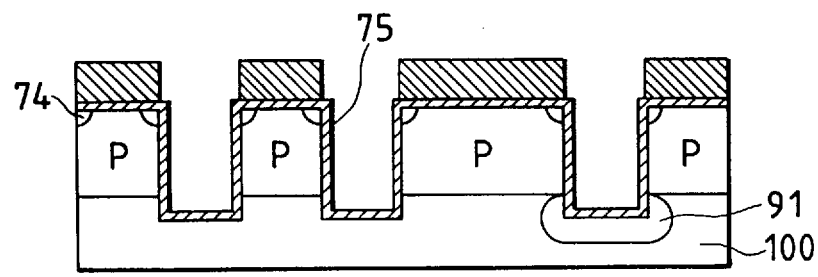
Figure 17L:
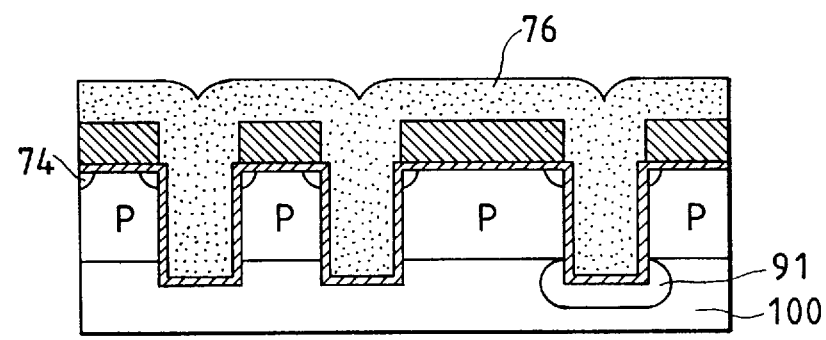
Figure 17M:
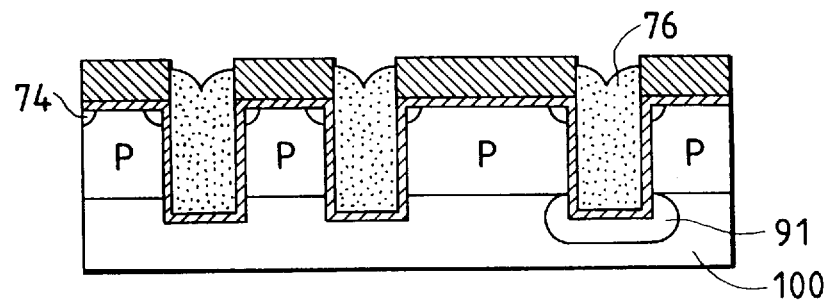
Figure 18:
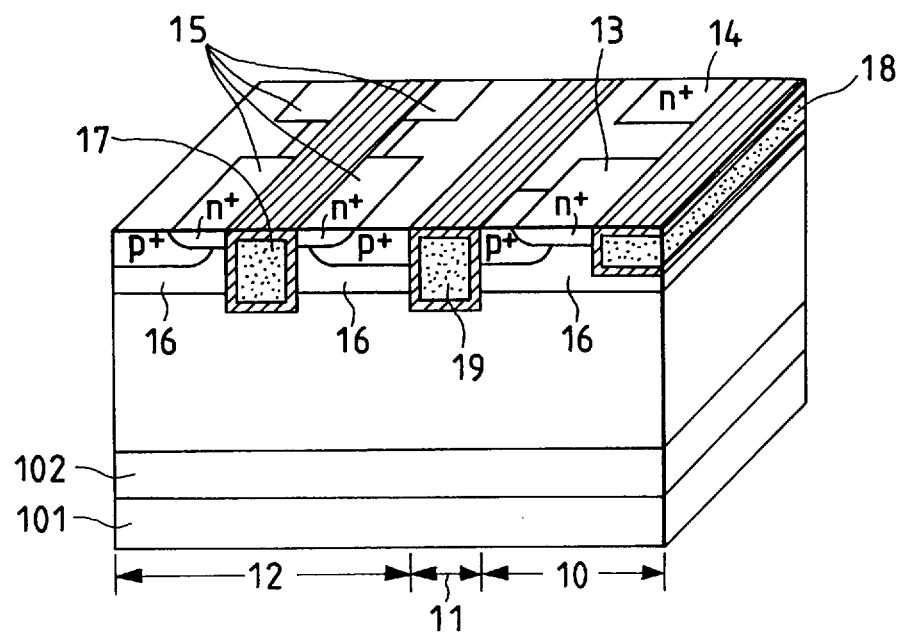
Figure 19:
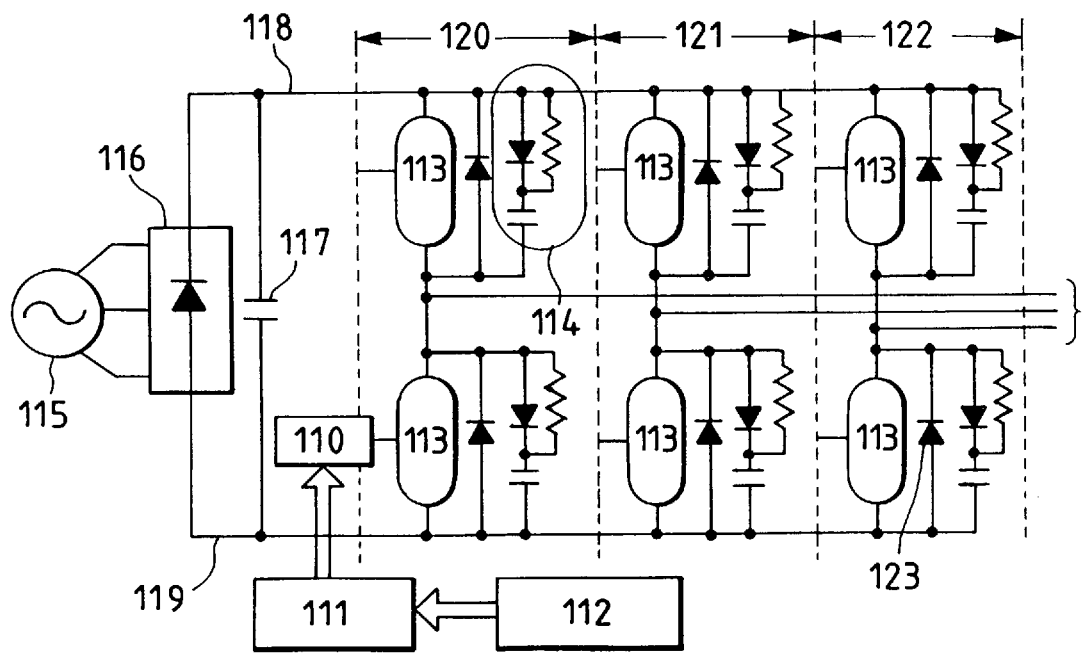
Figure 20:
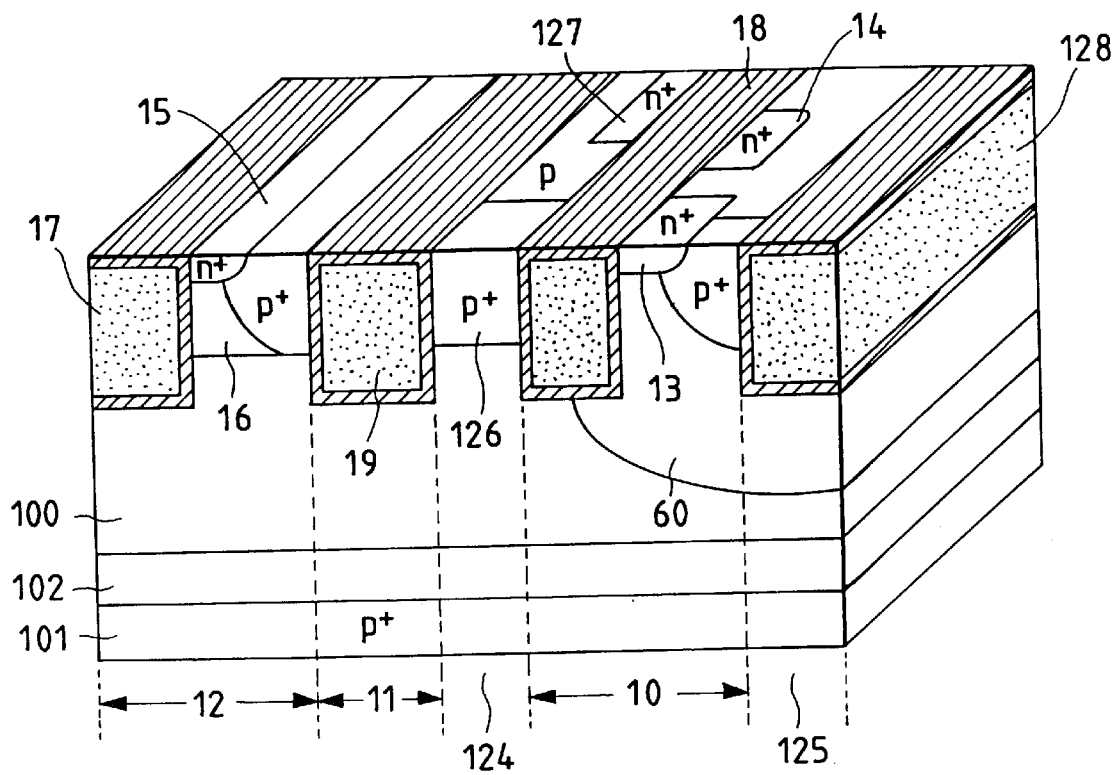
Figure 21:
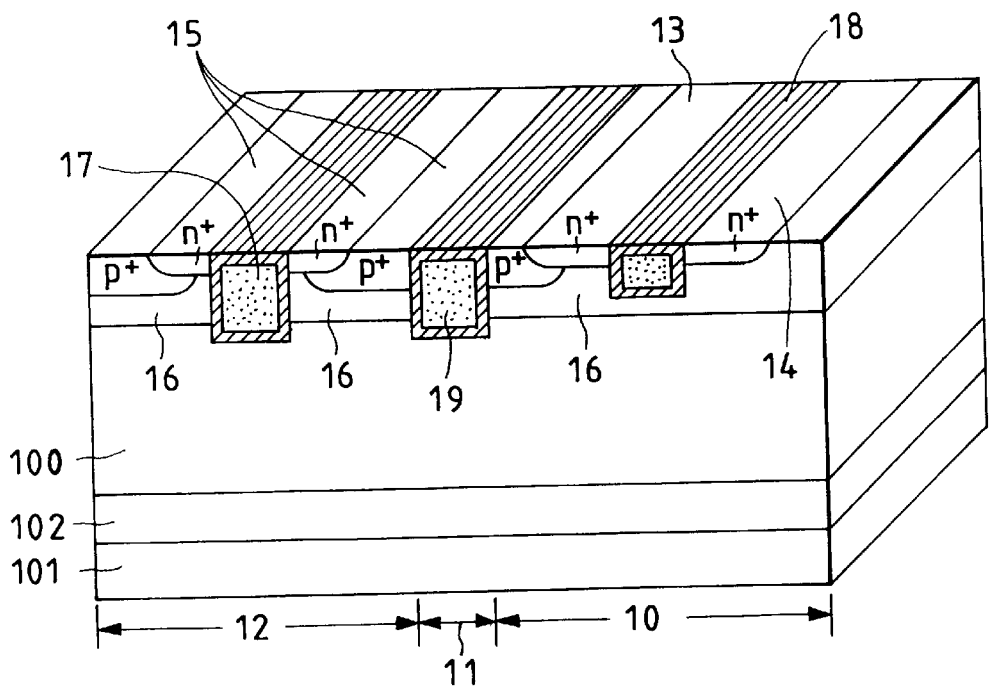

FIGS. 7(a)–7(e) are typical sectional views of a structure for fabricating the semiconductor device of FIG. 6 in different steps of a semiconductor device fabricating process;

FIGS. 8(f)–8(j) are typical sectional views of the structure shown in FIG. 7 in steps of manufacture following those shown in FIGS. 7(a)–7(e);

FIGS. 9(k)–9(o) are typical sectional views of the structure shown in FIG. 7 in steps following those shown in FIGS. 8(f)–8(j);

FIGS. 10(p)–10(t) are typical sectional views of the structure shown in FIG. 7 in steps following those shown in FIGS. 9(k)–9(o);

FIGS. 11(u)–11(x) are typical sectional views of the structure shown in FIG. 7 in steps following those shown in FIGS. 10(p)–10(t);

FIGS. 12(a)–12(e) are typical sectional views of a structure for fabricating the semiconductor device of FIG. 2 in successive steps of a semiconductor device fabricating process;

FIGS. 13(f)–13(j) are typical sectional views of the structure shown in FIG. 12 in steps following those shown in FIGS. 12(a)–12(e);

FIGS. 14(k)–14(l) are typical sectional views of the structure shown in FIGS. 13(f)–13(j); in steps following those shown in FIGS. 13(f)–13(j);

FIGS. 15(a)–15(e) are typical sectional views of a structure for fabricating the semiconductor device of FIG. 5 in successive steps of a semiconductor device fabricating process;

FIGS. 16(f)–16(j) are typical sectional views of the structure shown in FIGS. 15(a)–15(e) in steps following those shown in FIG. 15;

FIGS. 17(k)–17(m) are typical sectional views of the structure shown in FIG. 15 in steps following those shown in FIGS. 16(f)–16(j);

FIG. 18 is a typical perspective view of a trench gate IGBT provided with a plurality of divisional emitters;

FIG. 19 is a circuit diagram of an inverter provided with an IGBTs in accordance with the present invention;

FIG. 20 is a typical perspective view of an IGBT in accordance with the present invention provided with a resistor and a diode; and FIG. 21 is an IGBT in accordance with the present invention having a large channel width.

DESCRIPTION OF THE PREFERRED EMBODIMENTS

First Embodiment

Figure 1:
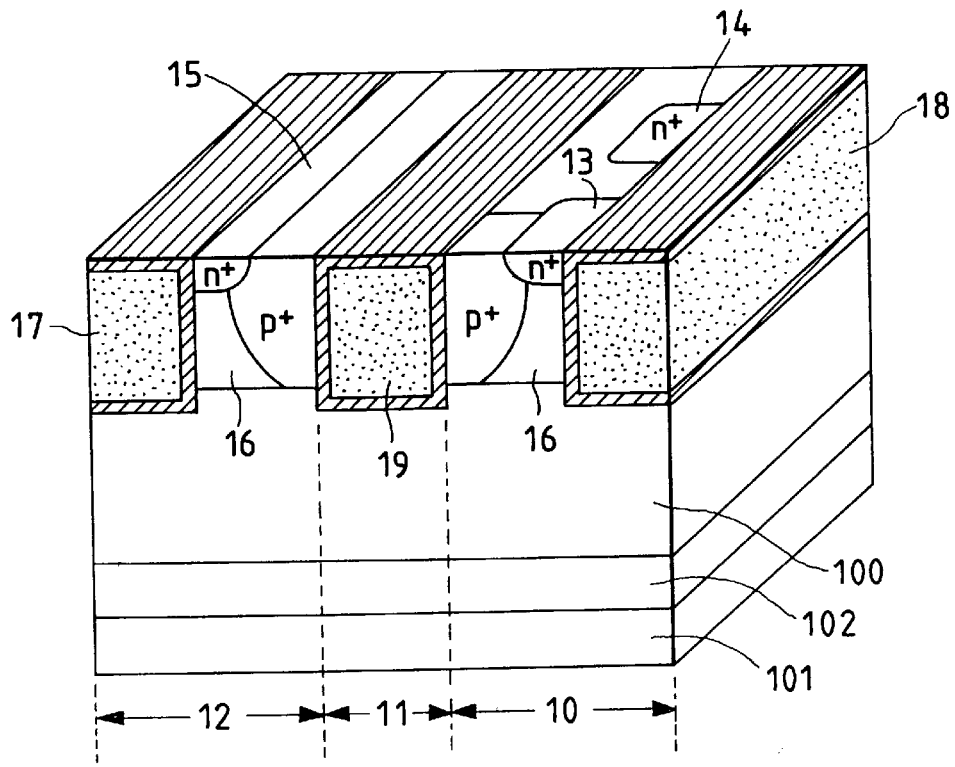
FIG. 1 is typical perspective view of a trench gate IGBT in a first embodiment according to the present invention.

FIG. 1 is a typical perspective view of an IGBT in a first embodiment according to the present invention.

Formed on a semiconductor substrate are a p$^+$-type collector 101, an n-type buffer 102 having an impurity concentration lower than that of the p$^+$-type collector 101 and contiguous with the p$^+$-type collector 101, and an n$^-$-type base 100 having an impurity concentration lower than that of the n-type buffer 102 and contiguous with the n-type buffer 102. A plurality of p-type bases 16 having an impurity concentration higher than that of the n-type base 100 are contiguous with the n-type base 100. A stripe-shaped n$^+$-type emitter 15 and a p$^+$-type layer are formed in the p-type base 16 in an IGBT region 12. The p$^+$-type layer is in contact with the n$^+$-type emitter 15 and the n$^-$-type base 100. Holes in the IGBT migrate through the p$^+$-type layer into an emitter electrode, not shown, to prevent latch-up. An n$^+$-type source 13 and an n$^+$-type drain 14 are formed in the p-type base 16 in a protective circuit forming region 10. The n$^+$-type source 13, the n$^+$-type drain 14, the p-type base 16 between the n$^+$-type source 13 and the n$^+$-type drain 14, and a trench gate, which will be described later, constitute a lateral MOSFET. This lateral MOSFET is a component of an overcurrent protective circuit for a vertical IGBT formed in the IGBT region 12. A p$^+$-type layer is formed in the p-type base 16 so as to be in contact with the n$^+$-type source 13 and the n$^-$-type base 100. This p$^+$-type layer prevents parasitic actions in the protective circuit forming region 10 and the latch-up of the vertical IGBT.

A plurality of trenches are formed in the surface of the semiconductor substrate in which the n$^+$-type emitter 15, the n$^+$-type source 13 and the n$^+$-type drain 14 are formed. The trenches are formed so as to reach the n$^-$-type base 100. The IGBT region 12 and the protective circuit forming region 10 are isolated from each other by the trenches. When the trenches are thus formed, raised portions and depressed portions are formed in the surface of the semiconductor substrate. The n$^+$-type emitter 15, the n$^+$-type source 13, the n$^+$-type drain 14, the p-type base 16 and the p$^+$-type layer are formed in the raised portions. MOS gate electrodes 18 and 19 are formed in the depressed portions, i.e., in the trenches. The n$^+$-type source 13 and the n$^+$-type drain 14 are in contact with the MOS gate electrode 18 through a gate oxide film and isolated from the MOS gate electrode 19. Therefore, the lateral MOSFET is controlled by the MOS gate electrode 18 and is not affected by the MOS gate electrode 19. The MOS gate electrode 19 serves as a control electrode of the IGBT.

An emitter electrode, not shown, is in ohmic contact with the n$^+$-type emitter 15 and the p$^+$-type layer in contact with the n$^+$-type emitter 15. A collector electrode, not shown, is in ohmic contact with the p$^+$-type collector 101. A source electrode, not shown, is in ohmic contact with the n$^+$-type source 13 and the p$^+$-type layer in contact with the n$^+$-type source 13. A drain electrode, not shown is in ohmic contact with the n$^+$-type drain 14.

Figure 4:
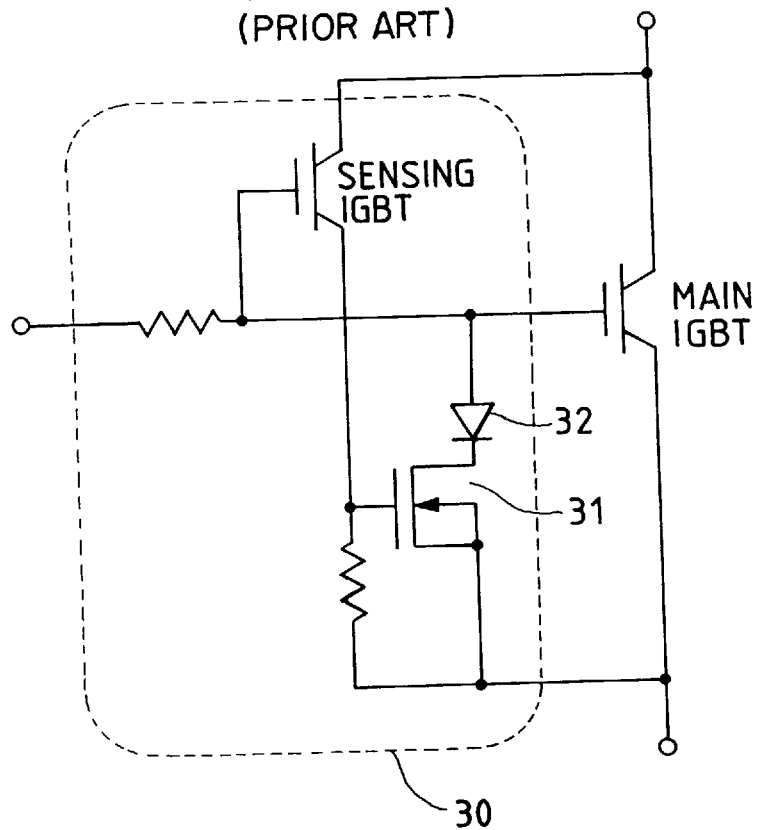
FIG. 4 is a circuit diagram of an IGBT provided with a built-in protective circuit.

In this embodiment, the vertical IGBT corresponds to a main IGBT or a sensing IGBT shown in FIG. 4. The lateral MOSFET corresponds to a MOSFET 31 included in an overcurrent protective circuit.

Second Embodiment

FIG. 2 is a typical perspective view of a semiconductor device in a second embodiment according to the present invention. This semiconductor device is characterized by trenches formed in an IGBT region 12 and an isolation region 11 and dividing a p-type base 16 into two sections and reaching an n$^-$-type base 100, and the bottom of a trench in an n-channel MOSFET region 10 is in the p-type base 16, i.e., not reaching the n$^-$-type base 100.

When a positive voltage is applied to a gate 17 in the IGBT region 12, an n-type inversion layer is formed in the p-type base 16, and electrons are injected from an n$^+$-type emitter 15 into the n$^-$-type base 100 to cause an IGBT operation. Since the trench in the isolation region 11 divides the p-type base 16 into two sections and reaches the n$^-$-type base 100, an n-channel MOSFET region 10 and the IGBT region 12 are isolated from each other.

The trench in the lateral MOSFET region 10 does not reach the n$^-$-type base 100 and its bottom is in the p-type base 16. Therefore, a vertical n-channel MOSFET comprising the n$^+$-type source 13, the p-type base 16 and the n$^-$-type base 100 like that formed in the IGBT region 12 is not formed, any electrons are not injected from the n$^+$-type source 13 into the n$^-$-type base 100 and any holes are not injected from a p$^+$-type collector 101 into the p-type base 16.

A lateral n-channel MOSFET can be formed by arranging n$^+$-type layers at intervals along the direction of extension of stripes of a trench gate and contiguously with a gate 18, and using those regions as a source 13 and a drain 14.

The n-channel MOSFET included in the IGBT does not require additional steps of fabrication, and a semiconductor device free from latch-up and capable of stable operation can be obtained.

Since the trench gate of the lateral n-channel MOSFET region 10 is formed in a depth so that the trench gate does not reach the n$^-$-type base 100 and the bottom of the trench gate is within the p-type base 16, any vertical MOSFET consisting of an n$^+$-type source, a p-type base and an n$^-$-type base and essential to the conventional IGBT is not formed. Thus, in the lateral MOSFET, the flow of electrons into the n$^-$-type base and the flow of holes from the p$^+$-type collector into the p-type base are prevented. Consequently, the lateral MOSFET is able to operate stably during the operation of the trench IGBT.

An n-channel MOSFET controlled by the gate 18 can be formed by forming n$^+$-type layers at intervals in the direction of the stripes of the gate 18 and using these regions as a source 13 and a drain 14. Since the p-type base 16 of the n-channel MOSFET region 10 and the p-type base 16 of the IGBT region 12 must be isolated from each other, a dummy gate 19 is formed so as to reach the n$^-$-type base 100.

Thus, the IGBT in this embodiment suppresses the IGBT of the n-channel MOSFET region 10 and hence the IGBT and the low-voltage lateral MOSFET can be formed in the same chip.

Third Embodiment

A semiconductor device in a third embodiment according to the present invention will be described with reference to FIGS. 5 and 6. The inhibition of the IGBT operation of a MOSFET region is an important point of the present invention. The IGBT operation of a MOSFET region can be inhibited by covering a trench gate in an n-channel MOSFET region 10 with a p-type base region as shown in FIGS. 5 and 6.

In FIG. 5, trench gates in an IGBT region 12 and an n-channel MOSFET region 10 have the same depth, and a p$^+$-type channel stopper 20 is formed so as to underlie the gate 18 of the n-channel MOSFET region 10.

In FIG. 6, the p-type bases of an IGBT region 12 and an n-channel MOSFET region 10 have different structures. A deep p-type base 60 is formed so as to cover the gate 18 of the n-channel MOSFET region 10 so that the gate 18 is isolated from an n$^-$-type base 100.

Thus, the IGBT operation of the n-channel MOSFET region 10 can be inhibited.

Fourth Embodiment

FIGS. 7 to 11 show typically steps of a method of fabricating a semiconductor device of the structure shown in FIG. 6.

In step a, a SiO$_2$ layer 71 is formed on an n$^-$-type base 100, i.e., a silicon substrate, by thermal oxidation, and a SiN layer 70 which is used as a mask for forming trenches 21 is deposited on the SiO$_2$ layer 71.

The SiN layer 70 is patterned in step b, portions of the patterned SiN layer 70 corresponding to the IGBT region 12 and the isolation region 11 are covered with a resist film 73 by a photolithographic process, and boron is implanted in portions of the n$^-$-type base 100 corresponding to the n-channel MOSFET region 10 in step c, and then the deep p-type base 60 is formed by thermal diffusion in step d.

Subsequently, the n-channel MOSFET region 10 is covered with a resist film 73 and boron ion implantation is carried out in step e, and then the structure is subjected to a heat treatment to form the n$^+$-type layer 74 in step f.

An As ion implantation process is carried out in step g to form the emitter, the source and the drain, and the structure is subjected to a heat treatment in step h to form the n$^+$-type layer 74.

Subsequently, portions of the n$^-$-type base 100 corresponding to the IGBT region, the isolation region and the n-channel MOSFET region are etched using the SiN layer 70 as a mask to form the trenches 21 in step i, and then the structure is subjected to thermal oxidation to form the gate oxide film 75 in step j.

Then, a polycrystalline Si layer 76 for forming the gate electrode is deposited in step k so as to fill up the trenches 21, and then the polycrystalline Si layer 76 is etched in step l so that portions of the polycrystalline Si layer 76 excluding those filling up the trenches 21 are removed.

Then the structure is subjected to selective oxidation using the SiN layer 70 as a mask in step m to deposit a SiO$_2$ layer 77 only over the polycrystalline Si layer 76.

The SiN layer 70 is removed in step n. A mask for As ion implantation to form an n$^+$-type layer, not shown, for enlarging the n$^+$-type layer 74 is formed by photolithography and As ion implantation is carried out in step o to form a source and a drain in the n-channel MOSFET region and an emitter contact region of IGBT, the structure is subjected to a heat treatment in step p to form an n$^+$-type layer 78, and a SiO$_2$ film 79 is deposited in step q.

Contact holes are formed in the IGBT region and the n-channel MOSFET region by photolithography and oxide film etching in step r, and the structure is subjected to thermal oxidation in step s before boron implantation.

Regions in which boron ions are to be implanted are defined by photolithography and boron ions are implanted in the same regions in step t, and then the structure is subjected to a heat treatment to form p$^+$-type layers 700 in the IGBT region and the n-channel MOSFET region in step u.

The oxide film formed prior to ion implantation in step t is removed in step v, an Al film 701 is deposited in step w, and then the Al film 701 is patterned in step x to complete the IGBT provided with the n-channel MOSFET.

Thus, the present invention fabricates the IGBT and the n-channel MOSFET simultaneously by the same process, so that the cost of fabricating the semiconductor device is substantially equal to that of fabricating the IGBT.

Fifth Embodiment

FIGS. 12 to 14 show typically steps of a method of fabricating a semiconductor device of the structure shown in FIG. 2. In FIG. 12, steps following that of forming the p-type base 16 are shown.

In step a, a SiO$_2$ layer 71 is formed on the p-type base 16 by thermal oxidation, and a SiN layer 70 which is used as a mask for forming trenches 21 is deposited on the SiO$_2$ layer 71. The SiN layer 70 is patterned in step b, and As+ ions are implanted in step c in regions in which an emitter, a source and a drain are to be formed.

The structure is subjected to a heat treatment in step d to form an n$^+$-type layer 74, and then an oxide film 80 is deposited in step e. Portions of the oxide film 80 corresponding to the IGBT region 12 and the isolation region 11 are etched in step f, and then portions of the p-type layer 16 corresponding to the IGBT region 12 and the isolation region 11 are etched in step g.

A portion of the oxide film 80 corresponding to an n-channel MOSFET is removed in step h and the p-type base 16 is etched in step i.

Thus, trenches of different depths are formed in the IGBT region 12 and the isolation region 11, and in the n-channel MOSFET region 10, respectively. A gate oxide film 75 is formed by thermal oxidation in step j, a polycrystalline Si film 76 is deposited in step k, and then the polycrystalline Si film 76 is etched back in step l.

Then, the same steps as steps m to x of the fourth embodiment are carried out to complete a semiconductor device like that shown in FIG. 2 provided with trenches of different depths in the IGBT region 12 and the n-channel MOSFET region 10, respectively.

Sixth Embodiment

FIGS. 15 to 17 show typically steps of a method of fabricating a semiconductor device of the structure shown in FIG. 5. In FIG. 15, steps following that of forming the p-type base 16 are shown.

Steps a to d of forming an n$^+$-type layer 74 are identical with those of the fifth embodiment. After the n$^+$-type layer 74 has been formed in step d, the p-type base 16 and the n$^-$-type base 100 are etched using the SiN layer 70 as a mask to form trenches 21 in step e. An oxide film 90 is deposited in step f. A resist film 73 is patterned by photolithography in step g to expose only a portion of the surface of the oxide film 90 corresponding to the n-channel MOSFET region 10, and then the oxide film 90 is etched in step h.

The oxide film 90 coating the bottoms of the trench 21 in the n-channel MOSFET region 10 is removed in step h. Boron is implanted in the bottom of the trench 21 in the n-channel MOSFET region 10 in step i, and the structure is subjected to a heat treatment in step j to form a channel stopper 91 in the bottom of the channel 21 and the oxide film 90 is removed.

Then, gate oxidation, the deposition of a polycrystalline Si film and the etching of the polycrystalline Si film are carried out by the same process as those of the fifth embodiment.

Thus, the semiconductor devices in the first to the third embodiment each comprising the trench gate IGBT including the MOSFET and having the built-in protective circuit can be fabricated by the semiconductor device fabricating methods in the fourth to the sixth embodiment.

The chip size of the semiconductor device provided with the built-in protective circuit is far smaller than that of a semiconductor device provided with a separate chip of a protective circuit, the speed of the overcurrent protecting operation is enhanced greatly and the short circuit endurance is expected to increase.

Seventh Embodiment

FIG. 18 is a typical perspective view of a segmental emitter IGBT having emitters arranged at intervals in the direction of gate stripes. In this embodiment, emitters 15 arranged at intervals in the direction of gate stripes in an n-channel MOSFET region 10 are used as a source 13 and a drain 14.

Eighth Embodiment

FIG. 19 is a circuit diagram of a three-phase inverter employing IGBTs 113 with a built-in MOSFET.

The three-phase inverter comprises a three-phase ac power supply 115, a converter 116, a smoothing capacitor 117, three IGBT pairs 120, 121 and 122 of IGBTs 113, a driver 110 for controlling the gate voltages of the IGBT pairs 120, 121 and 122, a logic circuit 111 for controlling the driver 110, and a controller 112. The operation of the three-phase inverter is as follows.

Three-phase ac currents are rectified into dc currents by the converter 116 and the smoothing capacitor 117. The IGBTs connected to an upper arm 118 and those connected to a lower arm 119 are turned on and off alternately to convert the dc currents into three-phase ac currents.

When a load connected to the output is short-circuited or the IGBTs of the same IGBT pair connected to the upper arm 118 and the lower arm 119 are turned on simultaneously due to control error, an overcurrent flows through the IGBTs to cause failure.

Since the IGBTs 113 with a built-in MOSFET, i.e., a overcurrent protecting circuit, embodying the present invention are employed as power switching devices, failure attributable to an overcurrent can be prevented.

Snubbers 114 suppress the generation of a surge voltage by the inductance of the wiring when the IGBTs are turned off. The snubbers 114 are not essential when the current capacity is small. FWDs (free wheeling diodes) 123 protects the switching devices in an inductance load mode.

Ninth Embodiment

FIG. 20 is a typical perspective view of a semiconductor device provided with a resistor 125 and a diode 124 for a protective circuit in addition to an n-channel MOSFET region 10. The diode 124 uses a portion of a p-type base between two trenches as an anode 126, and an n$^+$-type layer forming a source 13 and a drain 14 as a cathode 127.

A polycrystalline Si layer 128 forming the gates of the n-channel MOSFET and the IGBT serves as the resistor 125. Thus, all the components of the protective circuit can be formed without requiring additional steps.

Tenth Embodiment

In the foregoing embodiment, the lateral n-channel MOSFET uses the segmental n$^+$-type layers arranged along the length of the trench gate as the source 13 and the drain 14. Although such a structure has an advantage of reducing channel length, channel width is small because channel width is dependent on the depth of diffusion of the n$^+$-type layer. A semiconductor device shown in FIG. 21 incorporates improvements to overcome such a disadvantage.

Although gate length is long because a source 13 and a drain 14 are formed opposite to a trench gate, channel width is sufficiently large.

According to the present invention, an insulated gate semiconductor device having a trench gate can be provided with a built-in protective circuit, the insulated gate semiconductor device has a low collector saturation voltage and high short circuit endurance.

What is claimed is:

1. An insulated gate semiconductor device comprising a semiconductor substrate having raised portions and depressed portions in a surface of the substrate, and a first region and a second region wherein said first region includes:

a first semiconductor layer of a first conductivity type formed in at least one of the raised portions, a second semiconductor layer and a third semiconductor layer which are of a second conductivity type formed in the first semiconductor layer, and an insulated gate electrode formed in at least one of the depressed portions so as to be contiguous with a portion of the first semiconductor layer between the second and the third semiconductor layers;

wherein said second region includes:

a fourth semiconductor layer of the first conductivity type formed in another one of the raised portions, a fifth semiconductor layer of the second conductivity type formed in the fourth semiconductor layer, a sixth semiconductor layer of the second conductivity type formed contiguously with the fourth semiconductor layer, a seventh semiconductor layer of the first conductivity type formed at a side of the sixth semiconductor layer opposite a side thereof on which the fourth semiconductor layer is formed, and an insulated gate electrode formed in another one of the depressed portions so as to be contiguous with the surface of the fourth semiconductor layer;

wherein the insulated gate electrode in the second region is not contiguous with the portion of the first semiconductor layer between the second and the third semiconductor layers; and wherein the first semiconductor layer, the second semiconductor layer, the third semiconductor layer and the insulated gate electrode in the first region form a lateral MOSFET.

2. The insulated gate semiconductor device according to claim 1 further comprising a buffer layer of the second conductivity type formed between the sixth and the seventh semiconductor layer.

3. The insulated gate semiconductor device according to claim 1, wherein the first semiconductor layer extends over the bottom of the depressed portion in the first region.

4. The insulated gate semiconductor device according to claim 1, wherein the first region is a protective circuit region, and the second region is a main device region.

5. The insulated gate semiconductor device according to claim 3, wherein the depth of the depressed portion in the second region is greater than that of the depressed portion in the first region.

6. The insulated gate semiconductor device according to claim 5 further comprising a buffer layer of the second conductivity type formed between the sixth and the seventh semiconductor layer, the second conductivity type being of opposite conductivity type to the first conductivity type.

7. The insulated gate semiconductor device according to claim 4, wherein the depth of the first semiconductor layer is greater than that of the fourth semiconductor layer.

8. The insulated gate semiconductor device according to claim 7 further comprising a buffer layer of the second conductivity type formed between the sixth and the seventh semiconductor layer, the second conductivity type being of opposite conductivity type to the first conductivity type.

9. The insulated gate semiconductor device according to claim 1 further comprising a semiconductor region of the first conductivity type formed contiguously with the bottom of the depressed portion in the first region.

10. The insulated gate semiconductor device according to claim 9 further comprising a buffer layer of the second conductivity type formed between the sixth and the seventh semiconductor layer, the second conductivity type being of opposite conductivity type to the first conductivity type.

11. the insulated gate semiconductor device according to claim 1, wherein the fourth semiconductor layer, the fifth semiconductor layer, the sixth semiconductor layer, the seventh semiconductor layer and the insulated gate electrode in the second region from a vertical IGBT.

12. The insulated gate semiconductor device according to claim 11, wherein the lateral MOSFET is a component of a protective circuit for the vertical IGBT.

13. An insulated gate semiconductor device comprising a semiconductor substrate having raised portions and depressed portions in a surface of the substrate, and a first region and a second region, wherein said first region includes:
   a first semiconductor layer of a first conductivity type formed in at least one of the raised portions,
   a second semiconductor layer and a third semiconductor layer which are of a second conductivity type formed in the first semiconductor layer, and
   an insulated gate electrode formed in at least one of the depressed portions so as to be contiguous with a portion of the surface of the first semiconductor layer between the second and the third semiconductor layers; wherein said second region includes:
   a fourth semiconductor layer of the first conductivity type formed in another one of the raised portions,
   a fifth semiconductor layer of the second conductivity type formed in the fourth semiconductor layer,
   a sixth semiconductor layer of the second conductivity type formed contiguously with the fourth semiconductor layer, and
   an insulated gate electrode formed in another one of the depressed portions so as to be contiguous with the surface of the fourth semiconductor layer;
   wherein the insulated gate electrode in the second region is not contiguous with the portion of the first semiconductor layer between the second and the third semiconductor layers; and
   wherein the first semiconductor layer, the second semiconductor layer, the third semiconductor layer and the insulated gate electrode in the first region form a lateral MOSFET.

14. The insulated gate semiconductor device according to claim 13, wherein the first region is a protective circuit region, and the second region is a main device region.

15. The insulated gate semiconductor device according to claim 13, wherein the first semiconductor layer extends over the bottom of the depressed portion in the first region.

16. The insulated gate semiconductor device according to claim 15, wherein the depth of the depressed portion in the second region is greater than that of the depressed portion in the first region.

17. The insulated gate semiconductor device according to claim 15, wherein the depth of the first semiconductor layer is greater than that of the fourth semiconductor layer.

18. The insulated gate semiconductor device according to claim 13 further comprising a semiconductor region of the first conductivity type formed contiguously with the bottom of the depressed portion in the first region.

19. The insulated gate semiconductor device according to claim 13, wherein the fourth semiconductor layer, the fifth semiconductor layer, the sixth semiconductor layer and the insulated gate electrode in the second region form a vertical MOSFET.

20. The insulated gate semiconductor device according to claim 19, wherein the lateral MOSFET is a component of a protective circuit for the vertical MOSFET.

21. An inverter for converting dc power into ac power, comprising semiconductor switching devices which are turned on and off to convert dc power into ac power, each of the semiconductor switching devices comprising a semiconductor substrate having raised portions and depressed portions in a surface of the substrate, and a first region and a second region, wherein said first region includes:
   a first semiconductor layer of a first conductivity type formed in at least one of the raised portions,
   a second semiconductor layer and a third semiconductor layer which are of a second conductivity type formed in the first semiconductor layer, and
   an insulated gate electrode formed in at least one of the depressed portions so as to be contiguous with a portion of the first semiconductor layer between the second and the third semiconductor layers;
   wherein said second region includes:
   a fourth semiconductor layer of the first conductivity type formed in another one of the raised portions,
   a fifth semiconductor layer of the second conductivity type formed in the fourth semiconductor layer,
   a sixth semiconductor layer of the second conductivity type formed contiguously with the fourth semiconductor layer,
   a seventh semiconductor layer of the first conductivity type formed at a side of the sixth semiconductor layer opposite a side thereof on which the fourth semiconductor layer is formed, and
   an insulated gate electrode formed in another one of the depressed portions so as to be contiguous with the surface of the fourth semiconductor layer wherein the insulated gate electrode in the second region is not contiguous with the portion of the first semiconductor layer between the second and the third semiconductor layers; and wherein the first semiconductor layer, the second semiconductor layer, the third semiconductor layer and the insulated gate electrode in the first region form a lateral MOSFET.

22. The inverter according to claim 21, wherein in each of the semiconductor switching devices the fourth semiconductor layer, the fifth semiconductor layer, the sixth semiconductor layer, the seventh semiconductor layer and the insulated gate electrode in the second region form a vertical IGBT.

23. The inverter according to claim 22, wherein in each of the semiconductor switching devices the lateral MOSFET is a component of a protective circuit for the vertical IGBT.

24. The inverter according to claim 21 further comprising a buffer layer of the second conductivity type formed between the sixth and the seventh semiconductor layer, the second conductivity type being of opposite conductivity type to the first conductivity type.

25. The inverter according to claim 21,
wherein the first region is a protective circuit region, and the second region is a main device region, and
wherein the second conductivity type is opposite to that of the first conductivity type.

26. The inverter according to claim 21,
wherein the first semiconductor layer extends over the bottom of the depressed portion in the first region, and
wherein the second conductivity type is opposite to that of the first conductivity type.

27. The inverter according to claim 21,
wherein the depth of the depressed portion in the second region is greater than that of the depressed portion in the first region, and
wherein the second conductivity type is opposite to that of the first conductivity type.

28. The inverter according to claim 21,
wherein the depth of the first semiconductor layer is greater than that of the fourth semiconductor layer, and
wherein the second conductivity type is opposite to that of the first conductivity type.

29. The inverter according to claim 21 further comprising a semiconductor region of the first conductivity type formed contiguously with the bottom of the depressed portion in the first region, the second conductivity type being of opposite conductivity type to the first conductivity type.

30. An inverter for converting dc power into ac power, comprising semiconductor switching devices which are turned on and off to convert dc power into ac power, each of the semiconductor switching devices comprises a semiconductor substrate having raised portions and depressed portions in a surface of the substrate, and a first region and a second region, wherein said first region includes:

a first semiconductor layer of a first conductivity type formed in at least one of the raised portions, a second semiconductor layer and a third semiconductor layer which are of a second conductivity type formed in the first semiconductor layer, and an insulated gate electrode formed in at least one of the depressed portions so as to be contiguous with a portion of the surface of the first semiconductor layer between the second and the third semiconductor layers; wherein said second region includes:

a fourth semiconductor layer of the first conductivity type formed in another one of the raised portions, a fifth semiconductor layer of the second conductivity type formed in the fourth semiconductor layer, a sixth semiconductor layer of the second conductivity type formed contiguously with the fourth semiconductor layer, and an insulated gate electrode formed in another one of the depressed portions so as to be contiguous with the surface of the fourth semiconductor layer;

wherein the insulated gate electrode in the second region is not contiguous with the portion of the first semiconductor layer between the second and the third semiconductor layers; and wherein the first semiconductor layer, the second semiconductor layer, the third semiconductor layer and the insulated gate electrode in the first region form a lateral MOSFET.

31. The inverter according to claim 30,
wherein the first region is a protective circuit region, and the second region is a main device region, and
wherein the second conductivity type is opposite to that of the first conductivity type.

32. The inverter according to claim 30,
wherein the first semiconductor layer extends over the bottom of the depressed portion in the first region, and
wherein the second conductivity type is opposite to that of the first conductivity type.

33. The inverter according to claim 30,
wherein the depth of the depressed portion in the second region is greater than that of the depressed portion in the first region, and
wherein the second conductivity type is opposite to that of the first conductivity type.

34. The inverter according to claim 30,
wherein the depth of the first semiconductor layer is greater than that of the fourth semiconductor layer, and
wherein the second conductivity type is opposite to that of the first conductivity type.

35. The inverter according to claim 30 further comprising a semiconductor region of the first conductivity type formed contiguously with the bottom of the depressed portion in the first region, the second conductivity type being of opposite conductivity type to the first conductivity type.

36. The inverter according to claim 30, wherein in each of the semiconductor switching devices the fourth semiconductor layer, the fifth semiconductor layer, the sixth semiconductor layer and the insulated gate electrode in the second region form a vertical MOSFET.

37. The inverter according to claim 36, wherein in each of the semiconductor switching devices the lateral MOSFET is a component of a protective circuit for the vertical MOSFET.

* * * * *